US011894069B2

(12) United States Patent
Yang et al.

(10) Patent No.: US 11,894,069 B2
(45) Date of Patent: Feb. 6, 2024

(54) UNSELECTED SUB-BLOCK SOURCE LINE AND BIT LINE PRE-CHARGING TO REDUCE READ DISTURB

(71) Applicant: Micron Technology, Inc., Boise, ID (US)

(72) Inventors: Xiangyu Yang, San Jose, CA (US); Hong-Yan Chen, San Jose, CA (US); Ching-Huang Lu, Fremont, CA (US)

(73) Assignee: Micron Technology, Inc., Boise, ID (US)

( * ) Notice: Subject to any disclaimer, the term of this patent is extended or adjusted under 35 U.S.C. 154(b) by 180 days.

(21) Appl. No.: 17/591,361

(22) Filed: Feb. 2, 2022

(65) Prior Publication Data

US 2023/0024346 A1 Jan. 26, 2023

Related U.S. Application Data

(60) Provisional application No. 63/224,269, filed on Jul. 21, 2021.

(51) Int. Cl.
| G11C 16/04 | (2006.01) |
| G11C 16/26 | (2006.01) |
| G11C 16/10 | (2006.01) |
| G11C 16/30 | (2006.01) |
| G11C 16/24 | (2006.01) |
| G11C 16/08 | (2006.01) |

(52) U.S. Cl.
CPC .......... *G11C 16/26* (2013.01); *G11C 16/0433* (2013.01); *G11C 16/08* (2013.01); *G11C 16/102* (2013.01); *G11C 16/24* (2013.01); *G11C 16/30* (2013.01)

(58) Field of Classification Search
CPC ................................................ G11C 16/0433
USPC ...................................................... 365/185.05
See application file for complete search history.

(56) References Cited

U.S. PATENT DOCUMENTS 11,501,837 B1 * 11/2022 Prakash ............. G11C 16/0483

* cited by examiner

*Primary Examiner* — Hoai V Ho
(74) *Attorney, Agent, or Firm* — Lowenstein Sandler LLP (57) ABSTRACT

A memory device includes unselected sub-block, which includes bit line; drain select (SGD) transistor coupled with bit line; a source voltage line; source select (SGS) transistor coupled with source voltage; and wordlines coupled with gates of string of cells, which have channel coupled between the SGS/SGD transistors. Control logic coupled with unselected sub-block is to: cause the SGD/SGS transistors to turn on while ramping the wordlines from a ground voltage to a pass voltage associated with unselected wordlines in preparation for read operation; cause, while ramping the wordlines, the channel to be pre-charged by ramping voltages on the bit line and the source voltage line to a target voltage that is greater than a source read voltage level; and in response to wordlines reaching the pass voltage, causing the SGD and SGS transistors to be turned off, to leave the channel pre-charged to the target voltage during the read operation.

20 Claims, 9 Drawing Sheets

UNSELECTED SUB-BLOCK SOURCE LINE AND BIT LINE PRE-CHARGING TO REDUCE READ DISTURB

REFERENCE TO RELATED APPLICATION

This application claims the benefit of U.S. Provisional Patent Application No. 63/224,269, filed Jul. 21, 2021, the entirety of which is incorporated herein by reference.

TECHNICAL FIELD

Embodiments of the disclosure are generally related to memory sub-systems, and more specifically, relate to unselected sub-block source line and bit line pre-charging to reduce read disturb.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of some embodiments of the disclosure.

DETAILED DESCRIPTION

Embodiments of the present disclosure are directed to unselected sub-block source line and bit line pre-charging to reduce read disturb. In certain memory devices, a segmented select gate source (SGS) architecture is employed such that physical segments of sub-blocks are individually selectable to which to program or from which to read data. Originally, this segmented SGS (or SSGS) architecture was employed to alleviate Fowler-Nordheim (F-N) tunneling read disturb. A type of read disturb, however, can still occur in unprogrammed or erased cells that are connected to unselected wordlines of the same physical block, but the read disturb is more likely in cells that are in an unselected sub-block that shares wordlines with the selected sub-block. Herein, an unselected sub-block can be understood to be located in a different physical segment than the selected sub-block. A sub-block is "selected" when a voltage applied to a bit line (e.g., data line) is ramped while turning on both drain select and source select transistors so that the memory cell at the selected wordline can be read.

During a read operation, the unselected wordlines can be ramped even higher than the selected wordline voltage such that the electric field across the tunnel oxide becomes high, and may cause tunneling of electrons to the gate of the memory cells from the substrate channel of the unselected wordlines. The threshold voltage of the erased cells increases, and in severe cases, the cells are programmed unintentionally, which is a disturbance caused by the read operation.

In respect to read operations within sub-blocks of SSGS architecture, wordlines of sub-blocks are boosted during a voltage pass (Vpass) ramp up after a channel is floated, e.g., to further boost the channel and prevent the F-N tunneling. The channel can be a common channel shared with a string of memory cells within the sub-block, for example. The channel potential ($V_{channel}$) of sub-blocks within SSGS can be modulated by the timing of signals sent to the source select and drain select lines (SGS/SGD) that are coupled to SGS/SGD transistors. The challenge is, however, that wordline resistive-capacitive (RC) variations, SGS/SGD transistor threshold voltage (Vt) differences, and SGS/SGD resistive-capacitive variations make it difficult to accurately control the channel potential. An inability to control the channel potential causes instances of hot carrier injection (or "hot-e") into the channel, e.g., due to localized potential differences surrounding selected wordlines, with particular issues exhibited in unselected sub-blocks. For this reason, SSGS is often disabled on these memory devices to prevent hot carrier injection issues. With a large number of memory layers, full block read disturb (FBRD) can be a reliability limiter.

Aspects of the present disclosure address the above and other deficiencies through reducing the bias differential between the wordline and the channel of memory cells in the unselected sub-block, to thus reduce the occurrence of F-N tunneling read disturb without boosting the channel potential, as was described above. More specifically, control logic of the memory device can cause the SGD and SGS transistors to turn on while ramping the wordlines from a ground voltage, to an intermediate voltage, and ultimately to a pass voltage (Vpass) associated with unselected wordlines in preparation for a read operation. The control logic can further cause, while ramping the wordlines, the channel to be pre-charged by ramping voltages on the bit line and the source voltage line to a target voltage that is greater than a source read voltage level (e.g., approximately 0.5V to 2.0V greater). The source read voltage level can be understood herein to refer to a default source read voltage level normally supplied to a source voltage line during a read operation. The control logic can then, in response to the wordlines reaching the pass voltage, cause the SGD and SGS transistors to be turned off, to leave the channel pre-charged to the target voltage during the read operation. In this way, by pre-charging the channel of the string of memory cells of the unselected sub-block, the channel potential is higher and the aforementioned bias differential between the wordline of the memory cell and the channel is minimized. The control logic can selectively control the targeted pre-charge voltage level of the channel to minimize this bias.

Therefore, advantages of the systems and methods implemented in accordance with some embodiments of the present disclosure include, but are not limited to, the ability to leave SSGS enabled on memory devices while accurately controlling the channel potential through this pre-charging that was just described. An accurate channel potential control means that hot-e issues can be mitigated, e.g., via small changes in control waveforms. Further, since the pre-charging can be performed in parallel with other read-related operations, there is no expected performance impact. Other advantages will be apparent to those skilled in the art of read command handling optimization within a memory device discussed hereinafter.

Figure 1A:
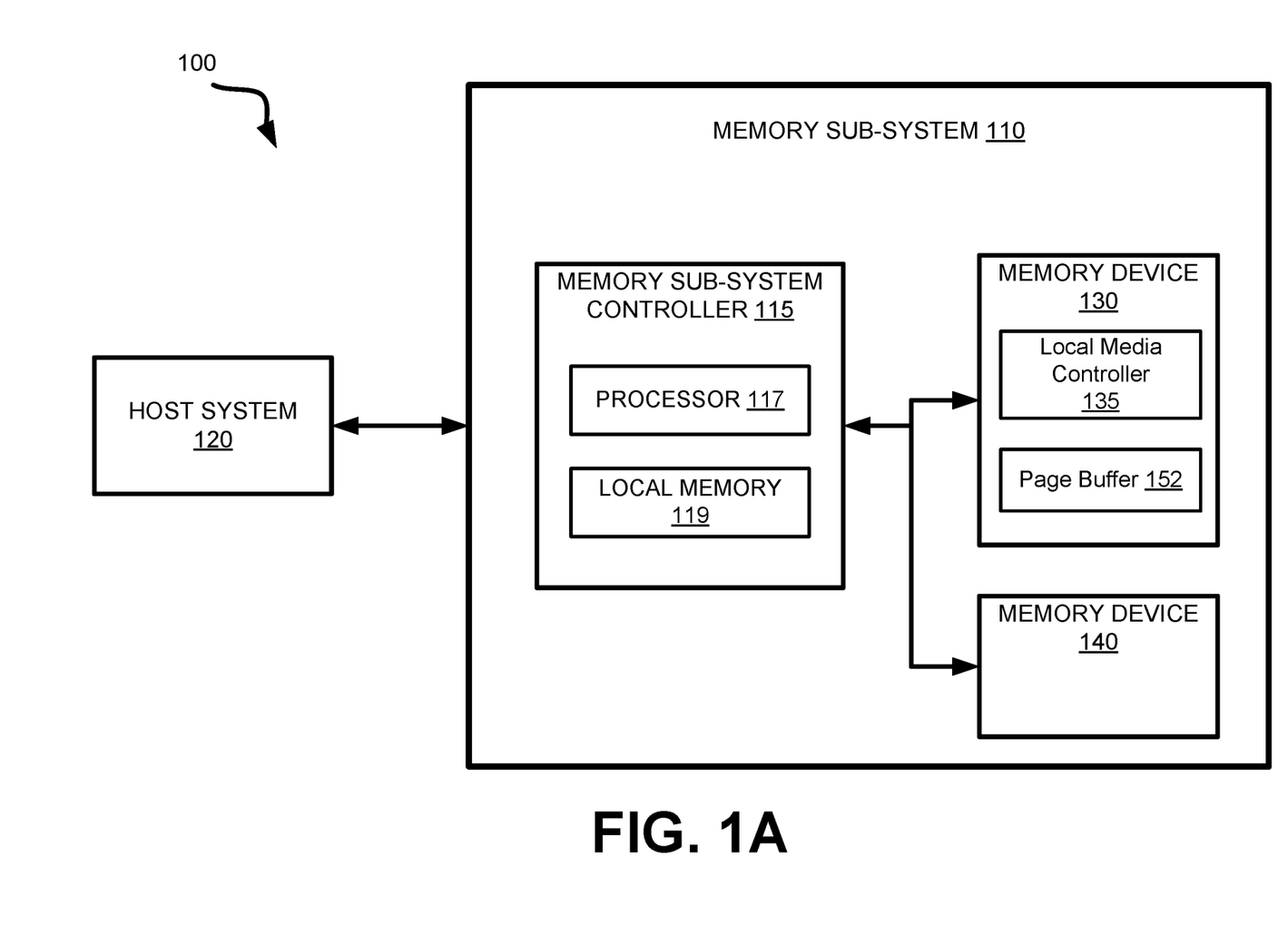
FIG. 1A illustrates an example computing system that includes a memory sub-system in accordance with some embodiments.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such media or memory devices. The memory sub-system 110 can be a storage device, a memory module, or a hybrid of a storage device and memory module.

The memory device 130 can be a non-volatile memory device. One example of non-volatile memory devices is a negative-and (NAND) memory device. A non-volatile memory device is a package of one or more dice. Each die can include one or more planes. Planes can be groups into logic units (LUN). For some types of non-volatile memory devices (e.g., NAND devices), each plane includes a set of physical blocks. Each block includes a set of pages. Each page includes a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1," or combinations of such values.

The memory device 130 can be made up of bits arranged in a two-dimensional or three-dimensional grid, also referred to as a memory array. Memory cells are formed onto a silicon wafer in an array of columns (also hereinafter referred to as bit lines) and rows (also hereinafter referred to as wordlines). A wordline can refer to one or more rows of memory cells of a memory device that are used with one or more bit lines to generate the address of each of the memory cells. The intersection of a bit line and wordline constitutes the address of the memory cell.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1A illustrates one example of a host system 120 coupled to one memory sub-system 110. The host system 120 can provide data to be stored at the memory sub-system 110 and can request data to be retrieved from the memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple-level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage a memory device 130 (e.g., perform media management operations on the memory device 130). In some embodiments, memory sub-system 110 is a managed memory device, which is a raw memory device 130 having control logic (e.g., local media controller 135) on the die and a controller (e.g., memory sub-system controller 115) for media management within the same memory device package. An example of a managed memory device is a managed NAND (MNAND) device.

In some embodiments, the memory device 130 includes a page buffer 152, which can provide the circuitry used to program data to the memory cells of the memory device 130 and to read the data out of the memory cells. Control logic of the local media controller 135 can be adapted to coordinate timing of the pre-charging of the channel potential of an unselected sub-block as will be explained in detail.

Figure 1B:
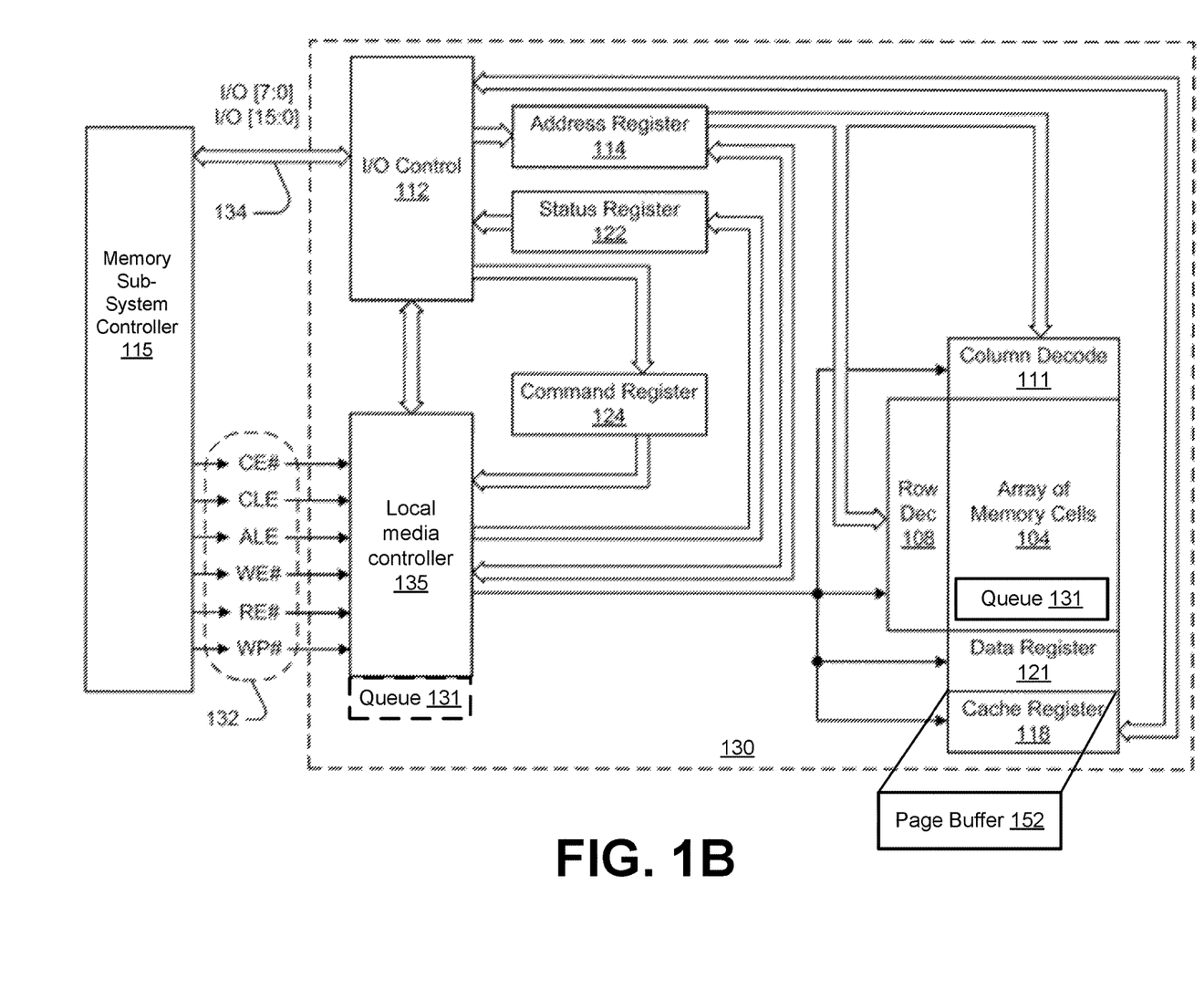
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., the memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), can be a memory controller or other external host device.

The memory device 130 includes an array of memory cells 104 logically arranged in rows and columns. Memory cells of a logical row are typically connected to the same access line (e.g., a word line) while memory cells of a logical column are typically selectively connected to the same data line (e.g., a bit line). A single access line can be associated with more than one logical row of memory cells and a single data line can be associated with more than one logical column. Memory cells (not shown in FIG. 1B) of at least a portion of the array of memory cells 104 are capable of being programmed to one of at least two target data states.

Row decode circuitry 108 and column decode circuitry 111 are provided to decode address signals. Address signals are received and decoded to access the array of memory cells 104. The memory device 130 also includes input/output (I/O) control circuitry 112 to manage input of commands, addresses and data to the memory device 130 as well as output of data and status information from the memory device 130. An address register 114 is in communication with the I/O control circuitry 112 and row decode circuitry 108 and column decode circuitry 111 to latch the address signals prior to decoding. A command register 124 is in communication with the I/O control circuitry 112 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 111 to control the row decode circuitry 108 and column decode circuitry 111 in response to the addresses.

The local media controller 135 is also in communication with a cache register 118 and a data register 121. The cache register 118 latches data, either incoming or outgoing, as directed by the local media controller 135 to temporarily store data while the array of memory cells 104 is busy writing or reading, respectively, other data. During a program operation (e.g., write operation), data can be passed from the cache register 118 to the data register 121 for transfer to the array of memory cells 104; then new data can be latched in the cache register 118 from the I/O control circuitry 112. During a read operation, data can be passed from the cache register 118 to the I/O control circuitry 112 for output to the memory sub-system controller 115; then new data can be passed from the data register 121 to the cache register 118. The cache register 118 and/or the data register 121 can form (e.g., can form at least a portion of) the page buffer 152 of the memory device 130. The page buffer 152 can further include sensing devices such as a sense amplifier, to sense a data state of a memory cell of the array of memory cells 104, e.g., by sensing a state of a data line connected to that memory cell. A status register 122 can be in communication with I/O control circuitry 112 and the local memory controller 135 to latch the status information for output to the memory sub-system controller 115.

The memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) can be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands can be received over input/output (I/O) pins [7:0] of I/O bus 134 at I/O control circuitry 112 and can then be written into a command register 124. The addresses can be received over input/output (I/O) pins [7:0] of I/O bus 134 at I/O control circuitry 112 and can then be written into address register 114. The data can be received over input/output (I/O) pins [7:0] for an 8-bit device or input/output (I/O) pins [15:0] for a 16-bit device at I/O control circuitry 112 and then can be written into cache register 118. The data can be subsequently written into data register 121 for programming the array of memory cells 104.

In an embodiment, cache register 118 can be omitted, and the data can be written directly into data register 121. Data can also be output over input/output (I/O) pins [7:0] for an 8-bit device or input/output (I/O) pins [15:0] for a 16-bit device. Although reference can be made to I/O pins, they can include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) can be used in the various embodiments.

Figure 2:
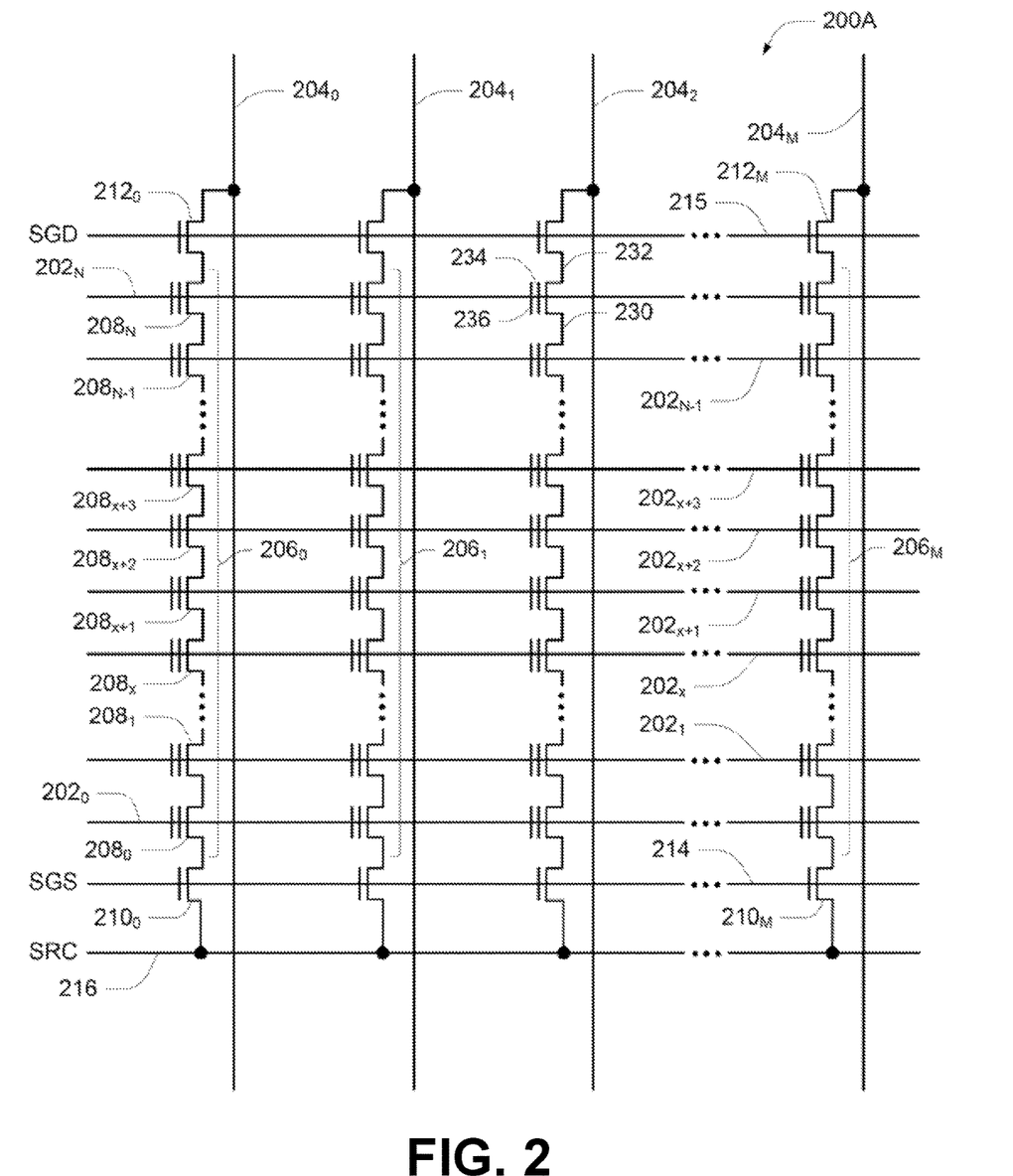
FIG. 2 is a schematic of portions of an array of memory cells as could be used in a memory of the type described with reference to FIG. 1B according to an embodiment.

FIG. 2 is a schematic of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as word lines $202_0$ to $202_N$, and data lines, such as bit lines $204_0$ to $204_M$. The word lines 202 can be connected to global access lines (e.g., global word lines), not shown in FIG. 2, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a word line 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 200A in FIG. 2 can be a quasi-two-dimensional memory array and can have a generally planar structure, e.g., where the common source 216, NAND strings 206 and bit lines 204 extend in substantially parallel planes. Alternatively, the memory array 200A in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a word line 202.

A column of the memory cells 208 can be a NAND string 206 or a number of NAND strings 206 selectively connected to a given bit line 204. A row of the memory cells 208 can be memory cells 208 commonly connected to a given word line 202. A row of memory cells 208 can, but need not, include all the memory cells 208 commonly connected to a given word line 202. Rows of the memory cells 208 can often be divided into one or more groups of physical pages of memory cells 208, and physical pages of the memory cells 208 often include every other memory cell 208 commonly connected to a given word line 202. For example, the memory cells 208 commonly connected to word line $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to word line $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 200A can be numbered consecutively from bit line $204_0$ to bit line $204_M$. Other groupings of the memory cells 208 commonly connected to a given word line 202 can also define a physical page of memory cells 208. For certain memory devices, all memory cells commonly connected to a given word line can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3A:
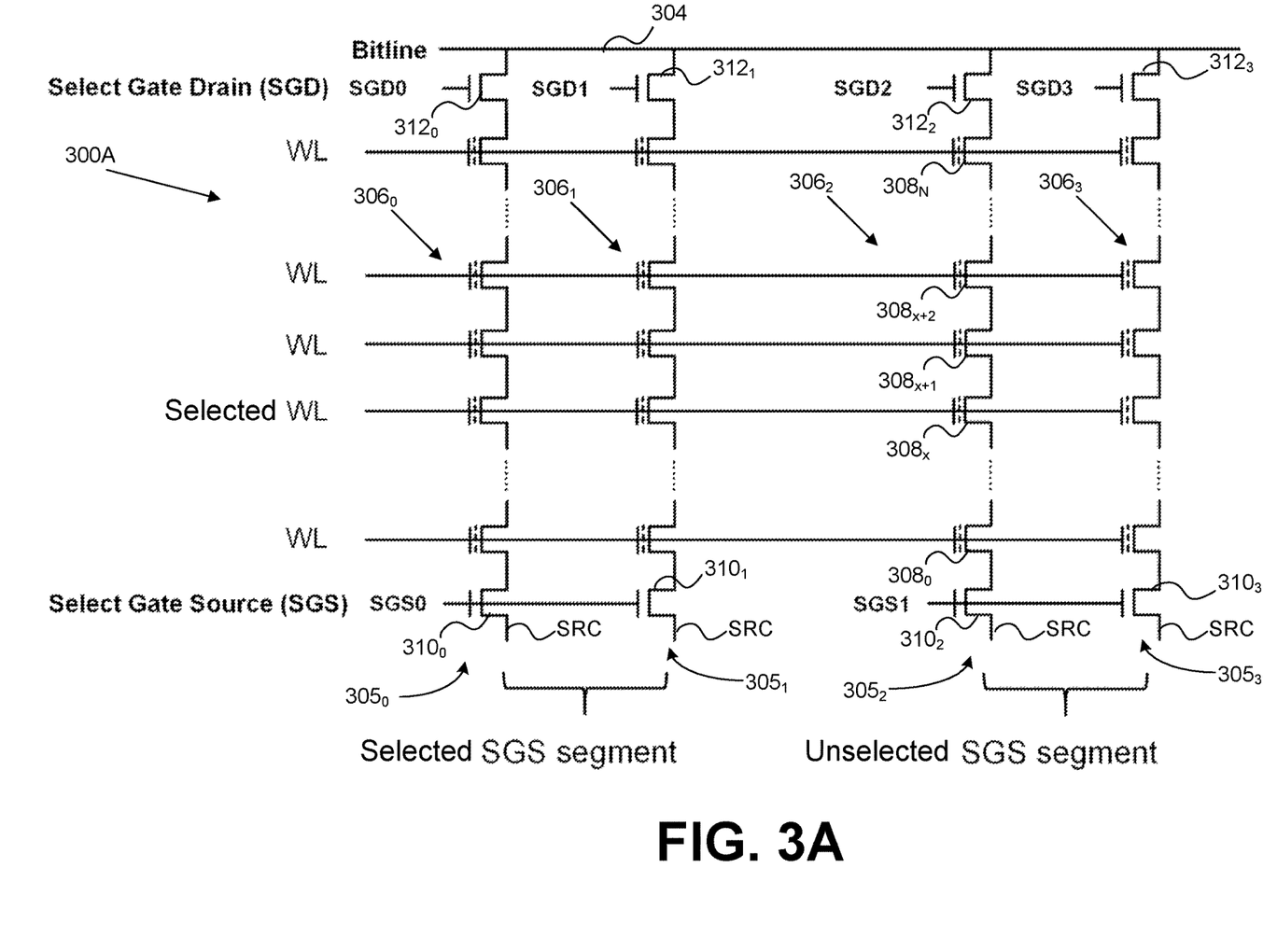
FIG. 3A is a schematic of two segments of an array of memory cells where a selected segment and an unselected segment share wordlines according to at least some embodiments.

FIG. 3A is a schematic of two segments of an array of memory cells 300A where a selected segment and an unselected segment share wordlines according to at least some embodiments. For example, in SSGS architecture, strings of memory cells can be grouped into sub-blocks, where there are two sub-blocks per SGS segment in some embodiments. A first (e.g., selected) SGS segment can include a first sub-block $305_0$ and a second sub-block $305_1$. A second (e.g., unselected) SGS segment can include a third sub-block $305_2$ and a fourth sub-block $305_3$. Other numbers of sub-blocks can be included in segments in other embodiments.

Figure 4:
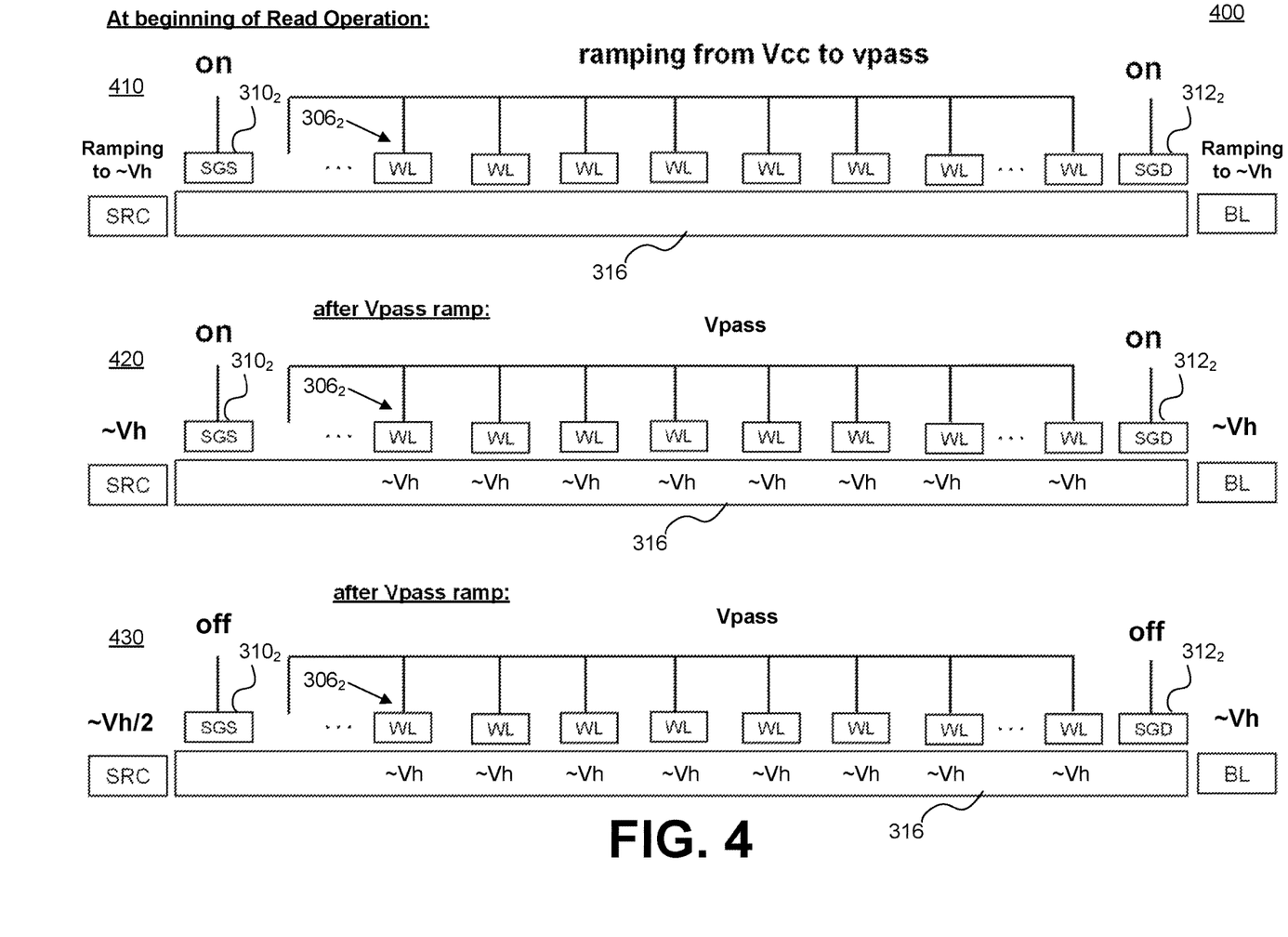
FIG. 4 is a series of side views of a string of memory cells having a common channel within an unselected sub-block illustrating a method of unselected sub-block source line and bit line pre-charging to reduce read disturb according to at least some embodiments.

Specifically, in at least some embodiments, the array of memory cells 300A of FIG. 3A includes a bit line 304, where each sub-block is coupled to the bit line 304. The first sub-block $305_0$ (assumed to be the selected sub-block for ease of explanation) can include a first drain select (SGD) transistor $312_0$, a first source select (SGS) transistor $310_0$, and a first string of memory cells $306_0$ coupled therebetween. The second sub-block $305_1$ can include a second SGD transistor $312_1$, a second SGS transistor $310_1$, and a second string of memory cells $306_1$ coupled therebetween. The third sub-block $305_2$ can include a third SGD transistor $312_2$, a third SGS transistor $310_2$, and a third string of memory cells $306_2$ coupled therebetween. The fourth sub-block $305_3$ can include a fourth SGD transistor $312_3$, a fourth SGS transistor $310_3$, and a fourth string of memory cells $306_3$ coupled therebetween. By way of example, the third string of memory cells $306_2$, included in the unselected SGS segment, includes multiple memory cells $308_0$ ... $308_N$. Each SGS transistor can be connected to a common source (SRC), e.g., a source voltage line, to provide voltage to the sources of the multiple memory cells $308_0$ ... $308_N$. In some embodiments, the source voltage line includes a source plate that supplies the source voltage. In at least some embodiments, multiple wordlines (WLs) are coupled with gates of memory cells of each string of memory cells $306_0$ ... $306_3$. Each string of memory cells includes a channel 316 coupled between the SGS transistor and SGD transistor of a sub-block, where the channel 316 is best seen in FIG. 4.

In these embodiments, a first drain select gate line (SGD0) can be connected to the gate of the first SGD transistor $312_0$, a second drain select gate line (SGD1) can be connected to the gate of the second SGD transistor $312_1$, a third drain select gate line (SGD2) can be connected to the gate of the third SGD transistor $312_2$, and a fourth drain select gate line (SGD3) can be connected to the gate of the fourth SGD transistor $312_3$. Further, a first source select gate line (SGS0) can be connected to gates of the first and second SGS transistors $310_0$ and $310_1$. Additionally, a second source select gate line (SGS1) can be connected to gates of the third and fourth SGS transistors $310_2$ and $310_3$. Thus, the source voltage of each string of memory cells can be jointly controlled by the source select gate line (SGS0 or SGS1) for a separate segment, creating the SSGS architecture, where the first segment is a combination of the first and second sub-blocks $305_0$ and $305_1$ and the second segment is a combination of the third and fourth sub-blocks $305_2$ and $305_3$.

Figure 3B:
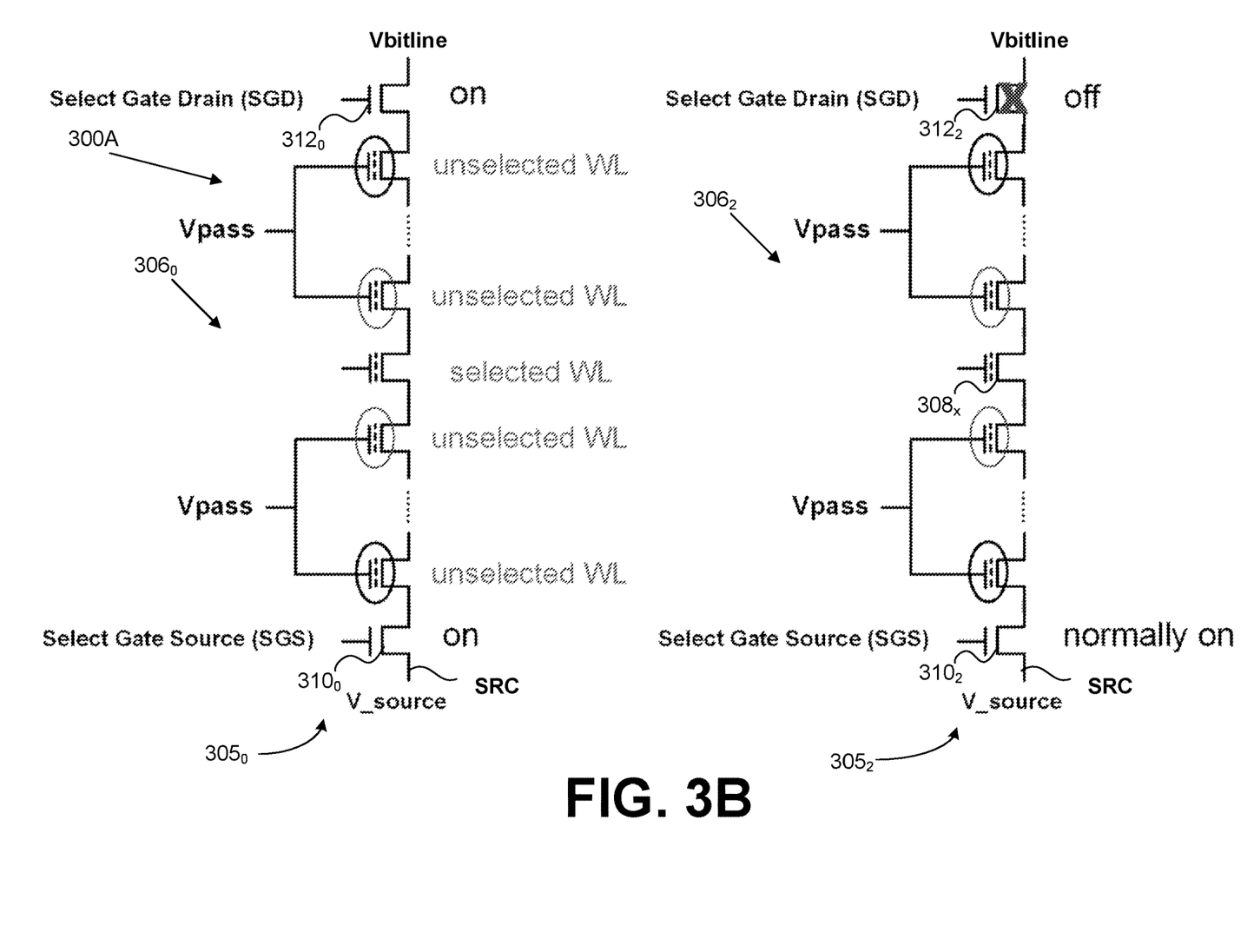
FIG. 3B is a modified schematic of two sub-blocks of FIG. 3A in which illustrates read signal sources associated with selecting a wordline in the selected sub-block and potential read disturb on the unselected sub-block according to at least some embodiments.

FIG. 3B is a modified schematic of two sub-blocks of FIG. 3A in which illustrates read signal sources associated with selecting a wordline in the selected sub-block and potential read disturb on the unselected sub-block according to at least some embodiments. For ease of explanation, assume the first sub-block $305_0$ is the selected sub-block and the third sub-block $305_2$ is the unselected sub-block. A read disturb can be created on memory cells connected to the unselected wordlines, which are within either of the selected sub-block $305_0$ or the unselected sub-block $305_2$. The fact that the SGD line has turned off the third SGD transistor $312_2$ illustrates that the third sub-block $305_2$ is unselected, for example.

In various embodiments, the read disturb can be caused by a voltage bias between the pass voltage (Vpass) applied to the unselected wordlines and source voltage (V_source) applied to the common source (SRC) end of the channel. Thus, one way of reducing this bias to alleviate (and potentially eliminate) F-N tunneling read disturb is to reduce the voltage between the gates/WLs of the memory cells and the channel of the memory cells of the unselected sub-block $312_2$, where the bit line 304 is disconnected by turning off the second SGD transistor $312_1$. One approach of achieving reduction in this bias is to pre-charge the channel and thus turn off the second SGD and SGS transistors $312_2$ and $310_2$ of the unselected sub-block (e.g., the third sub-block $305_2$) after Vpass ramp has completed. This thus avoids the need to boost the channel during Vpass ramp, which has a tendency to create anomalies in a difficult-to-control channel potential.

FIG. 4 is a series of side views of a string of memory cells, e.g., the third string of memory cells $306_2$, having a common channel 316 within an unselected sub-block illustrating a method 400 of unselected sub-block source line and bit line pre-charging to reduce read disturb according to at least some embodiments. This method 400 can be performed in generally three different phases of a read operation associated with the unselected sub-block, e.g., the third sub-block $305_2$ of FIGS. 3A-3B. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by control logic of the local media controller 135 of FIGS. 1A-1B.

Figure 5:
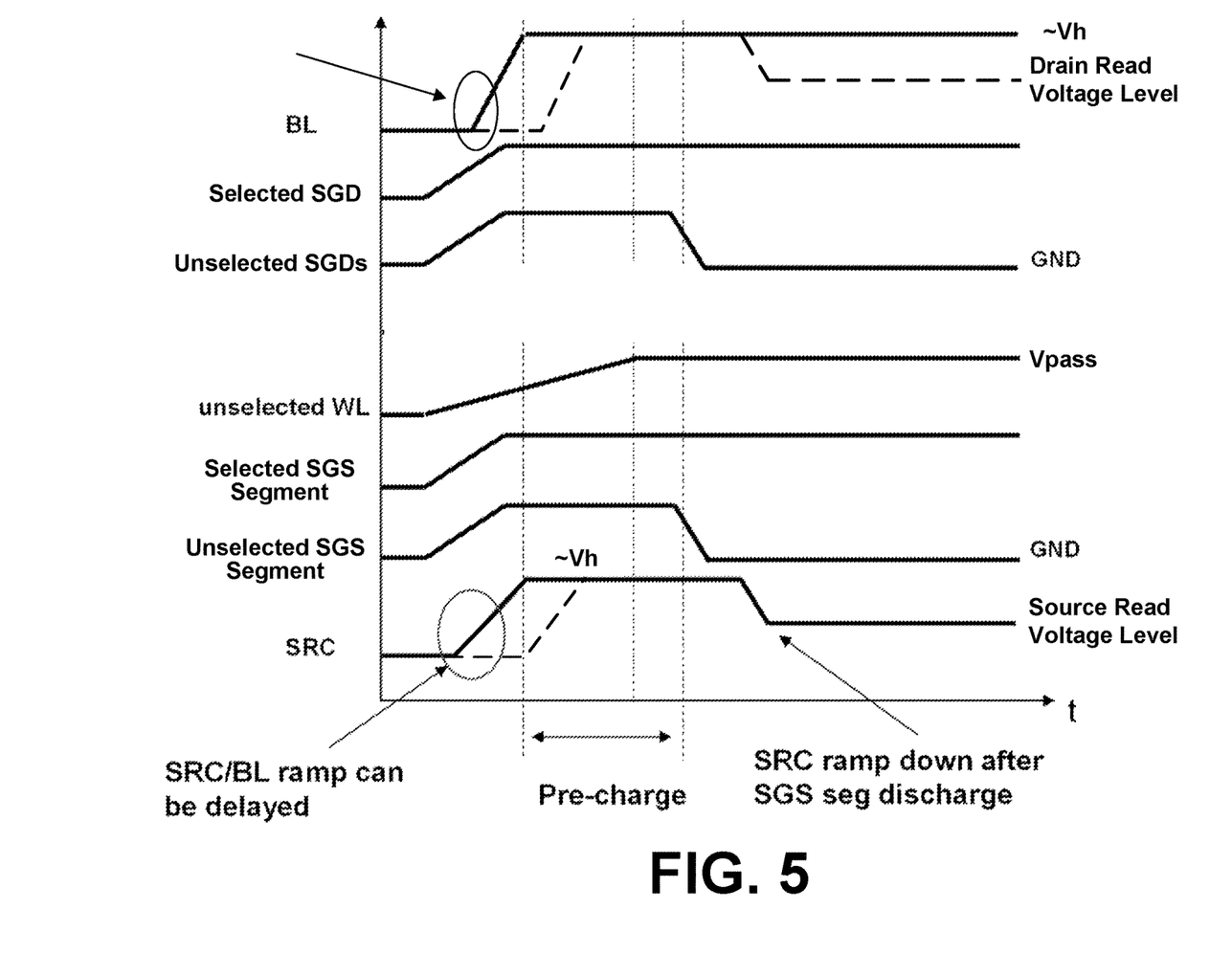
FIG. 5 is a graph illustrating signal waveforms to control various components of an unselected sub-block according to various embodiments.

FIG. 5 is a graph illustrating signal waveforms to control various components of the unselected sub-block (as well as the selected sub-block) according to various embodiments, which will also be referenced during the discussion of FIG. 4. The waveforms include, from top to bottom, bit line (BL), selected SGD signal (selected SGD), unselected SGD signals (unselected SGDs), unselected wordline signals (unselected WL), selected SGS segment signal (selected SGS segment), unselected SGS segment signal (unselected SGS segment), and common source (SRC), also referred to as source voltage line herein for clarity.

In at least some embodiments, and with reference to FIGS. 4-5, a first phase 410 of the method 400 includes the control logic causing the SGD and SGS transistors $312_2$ and $310_2$ to be activated (e.g., turned on) while ramping the wordlines (WL) from a ground voltage to an intermediate voltage and ultimately to a pass voltage (Vpass) associated with unselected wordlines in preparation for a read operation. This first phase 410 can be generally understood to come before the "pre-charge" phase in the graph of FIG. 5. Further, the source read voltage (on the source voltage line, or SRC) and the voltage on the bit line (at BL) can be ramped toward a target voltage (~Vh) that is higher than a normal voltage level for these lines.

In these embodiments, a second phase 420 of the method 400 includes the control logic causing, while ramping the wordlines, the channel 316 to be pre-charged by ramping voltages on the bit line (BL) and the source voltage line (SRC) to the target voltage (~Vh) that is greater than the source read voltage level. In various embodiments, the target voltage (~Vh) is between approximately 0.5V to 2.0V greater than the source read voltage level, where the target voltages of bit line and the source voltage line can vary within approximately 10% of each other, thus Vh is indicated as an approximate value. In one embodiment, the target voltage is between 0.8 to 1.5 volts (V), or approximately twice the pass voltage, Vpass. The actual value of the target voltage may depend on the value of the source read voltage level normally supplied to the unselected sub-block. While normally the SGD transistor $312_2$ would have been turned off, by keeping the SGD and SGS transistors $312_2$ and $310_2$ activated allows the source voltage line and the bit line to continue to ramp so that the channel 316 is fully pre-charged.

In some embodiments, causing the channel 316 to be pre-charged includes ramping the voltage of the source voltage line (SRC) after ramping the voltage on the bit line (BL), and thus this ramping of the source voltage line can be delayed until into the pre-charge phase, as illustrated in dashed lines in FIG. 5. In further embodiments, causing the channel to be pre-charged includes ramping the voltage of the bit line (BL) after ramping the voltage on the source voltage line (SRC), and thus this delaying the ramping of the BL voltage until into the pre-charge phase, as illustrated in dashed line in FIG. 5. Additionally, in some embodiments, the pre-charge phase can include ramping the voltage of one or both of the source voltage line (SRC) or the bit line (BL) after ramping the voltage of the wordlines. In some embodiments, the source voltage line (SRC) is ramped to the target voltage (e.g., ~Vh), the source voltage line is discharged to the source read voltage level after the SGS transistor is turned off. Similarly, in these embodiments, after the bit line (BL) voltage is ramped to approximately the target voltage (~Vh), the bit line voltage is discharged until reaching a default drain read voltage level normally used in read operations (illustrated with dashed line).

In at least some embodiments, a third phase 430 of the method 400 includes the control logic, in response to the wordlines reaching the pass voltage (Vpass), causing the SGD and SGS transistors $312_2$ and $310_2$ to be deactivated (e.g., turned off), to leave the channel 316 pre-charged to the target voltage (~Vh) during the read operation. The causing the SGD and SGS transistors to be turned off can occur before causing the source voltage line to be discharged, e.g., to the read source voltage level. In some embodiments, the control logic implements a delay before turning off the SGD and SGS transistors $312_2$ and $310_2$ to ensure the channel is fully pre-charged to the target voltage. In these embodiments, the potential (e.g., voltage level) of the channel 316 can be accurately controlled through pre-charging the channel 316 from the SRC and BL lines at the beginning of handling the read operation. Accurate channel potential means that hot-e concerns can be mitigated. For example, only small changes in the waveforms (see FIG. 5) might be needed to avoid hot-e issues.

In some embodiments, in response to the wordlines reaching the pass voltage, the method 400 further includes the control logic leaving the voltage of the bit line at the target voltage and causing the source voltage line to be discharged to a read voltage level, e.g., at about half the target voltage, or ~Vh/2, which can be between approximately 0.5V to 2.0V lower than Vh. Further, the method 400 can further include the control logic selecting a wordline of a second set of wordlines from a selected sub-block, where data is to be read from a memory cell coupled with the selected wordline in response to the read operation.

Figure 6:
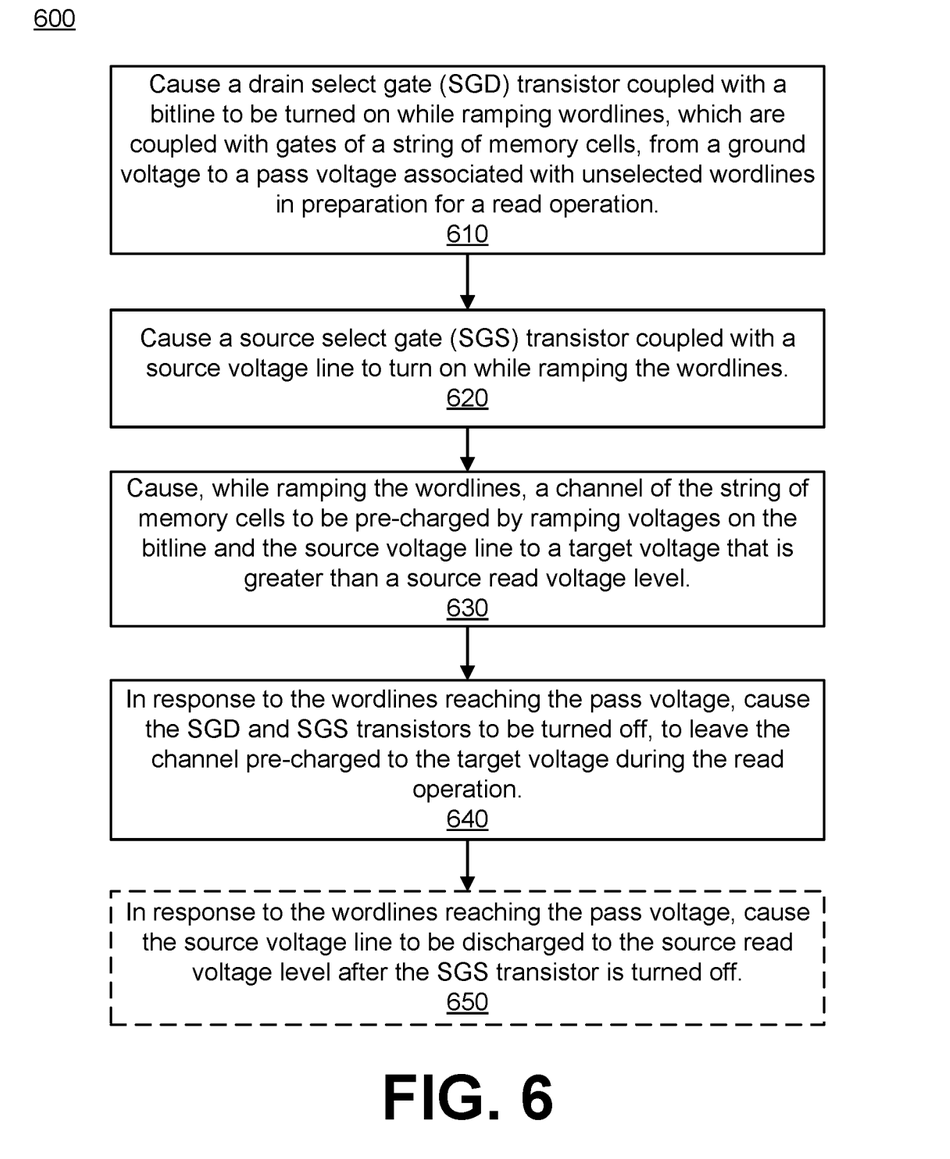
FIG. 6 is a flow diagram of an example method of unselected sub-block source line and bit line pre-charging to reduce read disturb according to at least some embodiments.

FIG. 6 is a flow diagram of an example method 600 of unselected sub-block source line and bit line pre-charging to reduce read disturb according to at least some embodiments. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the local media controller 135 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, an SGD transistor is turned on. For example, the processing logic causes a drain select (SGD) transistor coupled with a bit line to be activated (i.e., turned on) while ramping multiple wordlines, which are coupled with gates of a string of memory cells, from a ground voltage to a pass voltage associated with unselected wordlines in preparation for a read operation.

At operation 620, an SGS transistor is turned on. For example, the processing logic causes a source select (SGS) transistor coupled with a source voltage line to be activated (i.e., turned on) while ramping the multiple wordlines, where the string of memory cells is coupled between the SGD transistor and the SGS transistor and belongs to an unselected sub-block.

At operation 630, a channel is pre-charged. For example, the processing logic causes, while ramping the multiple wordlines, a channel of the string of memory cells to be pre-charged by ramping voltages on the bit line and the source voltage line to a target voltage that is greater than a source read voltage.

At operation 640, the SGD and SGS transistors are turned off. For example, in response to the multiple wordlines reaching the pass voltage, the processing logic causes the SGD and SGS transistors to be deactivated (i.e., turned off), to leave the channel pre-charged to the target voltage during the read operation.

At operation 650, in some embodiments, the SGS transistor is turned off. For example, in these embodiments, in response to the multiple wordlines reaching the pass voltage, the processing logic causes the source voltage line to be discharged to the source read voltage level after the SGS transistor is turned off. Further, the voltage on the bit line can also be discharged to the drain read voltage level.

Figure 7:
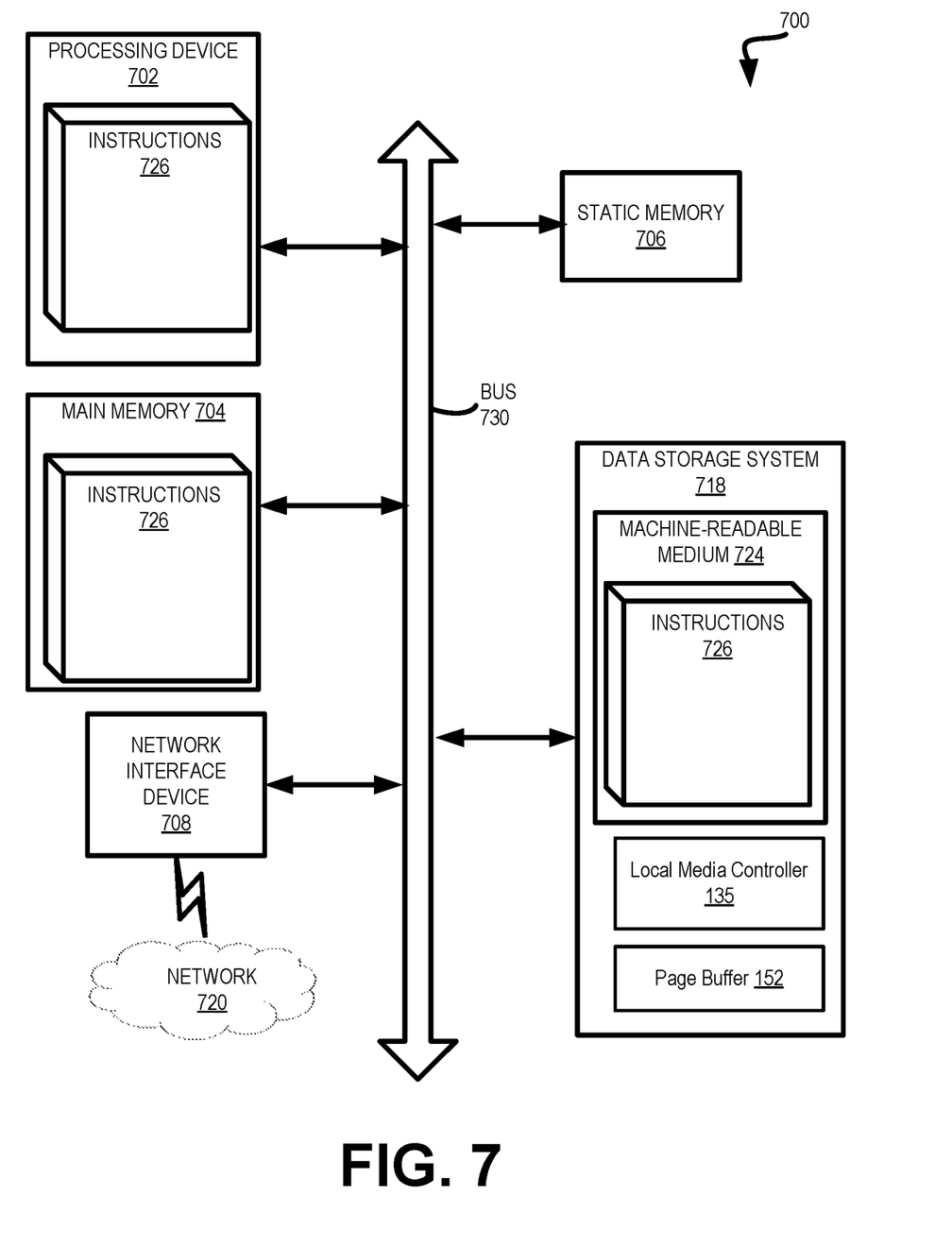
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to the memory sub-system controller 115 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 710 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 728 for performing the operations and steps discussed herein. The computer system 700 can further include a network interface device 712 to communicate over the network 720.

The data storage system 718 can include a machine-readable storage medium 724 (also known as a computer-readable medium) on which is stored one or more sets of instructions 728 or software embodying any one or more of the methodologies or functions described herein. The data storage system 718 can further include the local media controller 135 and the page buffer 152 that were previously discussed. The instructions 728 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1A.

In one embodiment, the instructions 726 include instructions to implement functionality corresponding to a controller (e.g., the memory sub-system controller 115 of FIG. 1A). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:
1. A memory device comprising:
an unselected sub-block comprising:
a bit line;
a drain select (SGD) transistor coupled with the bit line;
a source voltage line;
a source select (SGS) transistor coupled with the source voltage line; and
a plurality of wordlines coupled with gates of a string of memory cells, wherein the string of memory cells comprises a channel coupled between the SGS transistor and SGD transistor; and control logic operatively coupled with the unselected sub-block, the control logic to perform operations comprising:

causing the SGD and SGS transistors to be turned on while ramping the plurality of wordlines from a ground voltage to a pass voltage associated with unselected wordlines in preparation for a read operation;

causing, while ramping the plurality of wordlines, the channel to be pre-charged by ramping voltages on the bit line and the source voltage line to a target voltage that is greater than a source read voltage level; and in response to the plurality of wordlines reaching the pass voltage, causing the SGD and SGS transistors to be turned off, to leave the channel pre-charged to the target voltage during the read operation.

2. The memory device of claim 1, wherein the target voltage is between approximately 0.5V and 2.0V greater than the source read voltage level.

3. The memory device of claim 1, wherein the target voltage is between approximately 0.8V to 1.5V greater than the source read voltage level.

4. The memory device of claim 1, wherein, in response to the plurality of wordlines reaching the pass voltage, the operations further comprise:

leaving the voltage of the bit line at the target voltage; and
causing the source voltage line to be discharged to a source read voltage level.

5. The memory device of claim 4, wherein causing the SGD and SGS transistors to be turned off occurs before causing the source voltage line to be discharged.

6. The memory device of claim 1, wherein causing the channel to be pre-charged comprises ramping the voltage of the bit line after ramping the source voltage line.

7. The memory device of claim 1, wherein causing the channel to be pre-charged comprises ramping the voltage of the source voltage line after ramping the voltage on the bit line.

8. A method comprising:

causing a drain select (SGD) transistor coupled with a bit line to be turned on while ramping a plurality of wordlines, which are coupled with gates of a string of memory cells, from a ground voltage to a pass voltage associated with unselected wordlines in preparation for a read operation;

causing a source select (SGS) transistor coupled with a source voltage line to be turned on while ramping the plurality of wordlines, wherein the string of memory cells is coupled between the SGD transistor and the SGS transistor and belong to an unselected sub-block;

causing, while ramping the plurality of wordlines, a channel of the string of memory cells to be pre-charged by ramping voltages on the bit line and the source voltage line to a target voltage that is greater than a source read voltage level; and in response to the plurality of wordlines reaching the pass voltage, causing the SGD and SGS transistors to be turned off, to leave the channel pre-charged to the target voltage during the read operation.

9. The method of claim 8, wherein the target voltage is between approximately 0.5V to 2.0V greater than the source read voltage level.

10. The method of claim 8, wherein the target voltage is between approximately 0.8V to 1.5V greater than the source read voltage level.

11. The method of claim 8, wherein, in response to the plurality of wordlines reaching the pass voltage, the method further comprising:

leaving the voltage of the bit line at the target voltage; and
causing the source voltage line to be discharged to the source read voltage level.

12. The method of claim 11, wherein turning off the SGD and SGS transistors occurs before causing the source voltage line to be discharged.

13. The method of claim 8, further causing the channel to be pre-charged comprises ramping the voltage of one of the source voltage line or the bit line after ramping the voltages on the plurality of wordlines.

14. The method of claim 8, wherein causing the channel to be pre-charged comprises ramping the voltage of the source voltage line after ramping the voltage on the bit line.

15. A method comprising:

causing a drain select (SGD) transistor coupled with a bit line to be turned on while ramping a plurality of wordlines, which are coupled with gates of a string of memory cells, from a ground voltage to a pass voltage associated with unselected wordlines in preparation for a read operation;

causing a source select (SGS) transistor coupled with a source voltage line to be turned on while ramping the plurality of wordlines, wherein the string of memory cells is coupled between the SGD transistor and the SGS transistor and belong to an unselected sub-block;

causing, while ramping the plurality of wordlines, a channel of the string of memory cells to be pre-charged by ramping voltages on the bit line and the source voltage line to a target voltage that is greater than a source read voltage level; and in response to the plurality of wordlines reaching the pass voltage:

causing the SGD and SGS transistors to be turned off, to leave the channel pre-charged to the target voltage during the read operation; and
causing the source voltage line to be discharged to the source read voltage level after the SGS transistor is turned off.

16. The method of claim 15, wherein the target voltage is between approximately 0.5V to 2.0V greater than the source read voltage level.

17. The method of claim 15, wherein, in response to the plurality of wordlines reaching the pass voltage, further comprising leaving the voltage of the bit line at the target voltage.

18. The method of claim 15, wherein the causing the source voltage line to be discharged to the source read voltage level is performed after the SGD transistor is turned off.

19. The method of claim 15, wherein causing the channel to be pre-charged comprises ramping the voltage of the bit line after ramping the voltage of the source voltage line.

20. The method of claim 15, wherein causing the channel to be pre-charged comprises ramping the voltage of the source voltage line after ramping the voltage on the bit line.

* * * * *